United States Patent [19]
Ontko et al.

[11] Patent Number: 5,243,490
[45] Date of Patent: Sep. 7, 1993

[54] ESD PROTECTED FAMOS TRANSISTOR

[75] Inventors: George S. Ontko, Houston; David D. Wilmoth, Plano, both of Tex.

[73] Assignee: Texas Instruments Incorporated, Dallas, Tex.

[21] Appl. No.: 950,763

[22] Filed: Sep. 24, 1992

Related U.S. Application Data

[63] Continuation of Ser. No. 800,696, Dec. 2, 1991, abandoned, which is a continuation of Ser. No. 372,983, Jun. 28, 1989, abandoned.

[51] Int. Cl.$^5$ .................. H02H 3/20; G11C 16/04
[52] U.S. Cl. .................................. 361/91; 365/228
[58] Field of Search ............. 361/56, 91, 111; 365/226, 228; 357/23.13

[56] References Cited

U.S. PATENT DOCUMENTS

| | | | |
|---|---|---|---|
| 4,385,337 | 5/1983 | Asano et al. | 361/91 |
| 4,527,213 | 7/1985 | Ariizumi | 361/56 |
| 4,630,162 | 12/1986 | Bell et al. | 361/111 |
| 4,692,834 | 9/1987 | Iwahashi et al. | 361/91 |

Primary Examiner—R. Skudy
Assistant Examiner—D. R. Haszko
Attorney, Agent, or Firm—Theodore D. Lindgren; Leo N. Heiting; Richard L. Donaldson

[57] ABSTRACT

A FAMOS memory bit (40) is protected from voltage spike caused by an electrostatic discharge or otherwise by an ESD protection circuit (12). Responsive to a voltage spike on $V_{pp}$, the ESD protection circuit (12) couples the drain of the FAMOS memory bit (40) to $V_{cc}$ or another high capacitance node.

17 Claims, 1 Drawing Sheet

ESD PROTECTED FAMOS TRANSISTOR

This application is a continuation of application Ser. No. 07/800,696, filed Dec. 2, 1991, now abandoned, which is a continuation of application Ser. No. 07/372,983, filed Jun. 28, 1989, now abandoned.

TECHNICAL FIELD OF THE INVENTION

This invention relates in general to integrated circuits, and more particularly to a circuit design to protect inadvertent programming of a FAMOS transistor during an electrostatic discharge.

BACKGROUND OF THE INVENTION

During handling of integrated circuit ("IC") chips, an electrostatic discharge ("ESD") may occur between the handler and the pins of the IC. The electrostatic discharge presents a high voltage to one or more of the IC pins. In some cases, the discharge may be powerful enough to destroy some of the devices on the IC.

Even where the devices on the chips are not destroyed, an electrostatic discharge may have negative effects. In some cases, the IC may contain one or more single bit FAMOS transistors to provide nonvolatile storage of information. These transistors are structurally identical to the FAMOS transistor used in an EPROM array. During an ESD strike on the integrated circuit, the programming signal ($V_{pp}$) attached to the drains of one or more FAMOS transistors may be elevated to a voltage which is sufficient to program the FAMOS transistors. Inadvertent programming of the FAMOS transistors may affect the proper functioning of the IC.

Therefore, a need has arisen in the industry to provide protection for FAMOS transistors during an ESD strike.

SUMMARY OF THE INVENTION

In accordance with the present invention, a ESD protection method and apparatus is provided which substantially eliminates or prevents the disadvantages associated with prior ESD protection devices.

A FAMOS bit has a control gate selectively connected to $V_{cc}$, a source selectively connected to ground, and a drain selectively connected to $V_{pp}$. During an ESD strike, the $V_{pp}$ signal connected to the drain of the FAMOS bit may reach a sufficient voltage to program the bit (i.e., place a high voltage in the floating gate of the FAMOS bit). The circuit of the present invention detects a rise in the voltage of $V_{pp}$ and, in response thereto, connects the drain of the FAMOS bit to a high capacitance node. One such high capacitance node which is readily available is the $V_{cc}$ node.

In one embodiment of the present invention, the FAMOS bit is used to implement a lock-out circuit which prevents programming an EPROM array once the FAMOS bit is programmed. If the FAMOS device is inadvertently programmed, the user will be unable to program the device. Hence, the ESD protection circuit of the present invention prevents inadvertent programming of the device due to an ESD strike by connecting a high capacitance to the drain of the FAMOS bit.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

Figure 1:
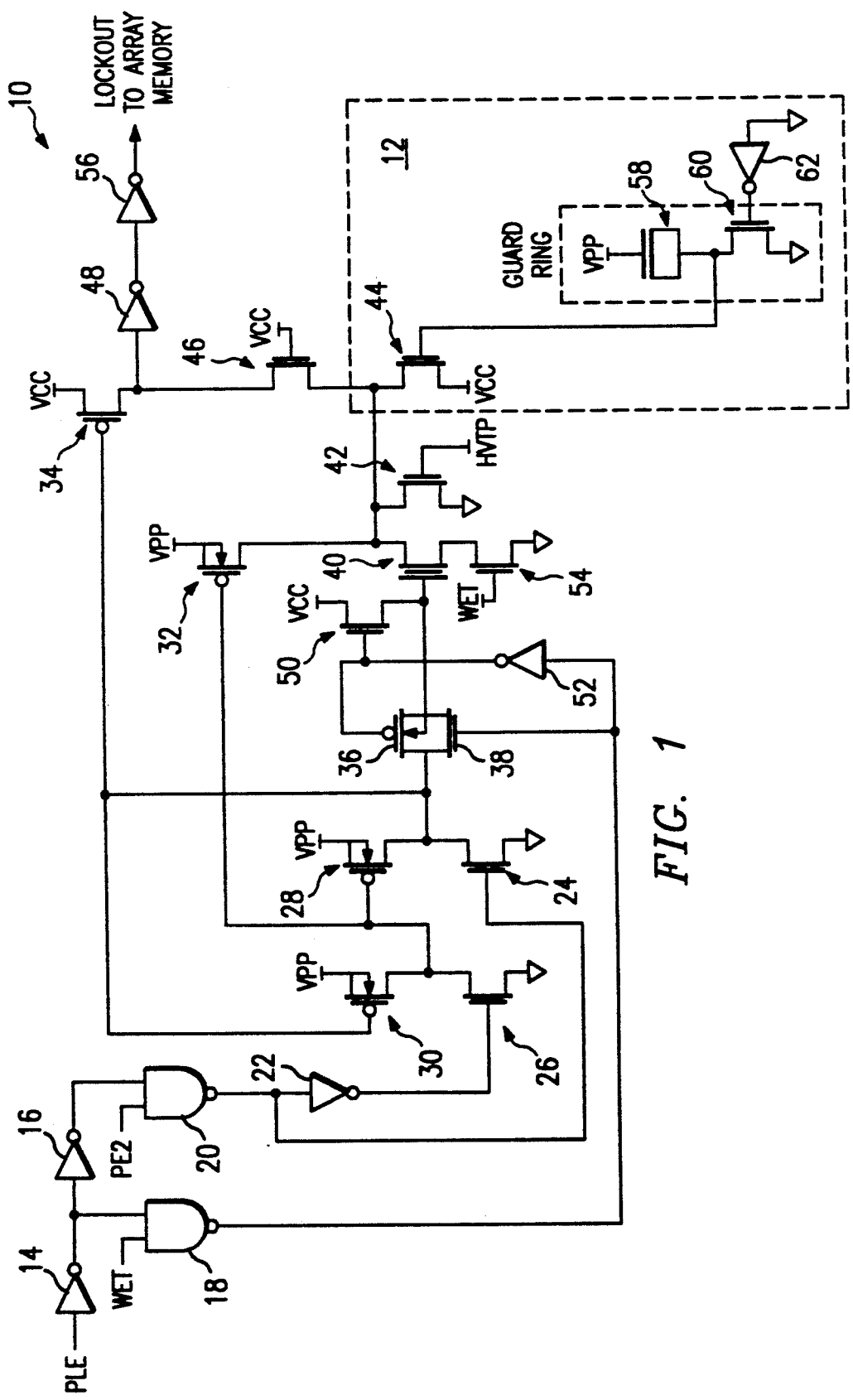
FIG. 1 illustrates a circuit diagram of a lock-bit circuit employing ESD protection to prevent inadvertent programming of a FAMOS bit.

The preferred embodiment of the present invention is best understood by referring to FIG. 1 of the drawings, like numeral being used for like and corresponding parts of the various drawings.

FIG. 1 illustrates a circuit diagram of a lock-bit circuit having ESD protection. The lock-bit circuit 10 includes a ESD protection circuit 12. The lock-bit circuit 10 is responsive to three signals: program lock enable (PLE), write enable true (WET) and program enable two (PE2). PLE is connected to an inverter 14, whose output is connected to an inverter 16 and to a NAND gate 18. WET is connected to the other input to the NAND gate 18. The output to the inverter 16 is input to a NAND gate 20 along with the PE2 signal. The output of the NAND gate 20 is connected to the input of an inverter 22 and to the gate of a N-channel transistor 24. The output of the inverter 22 is connected to the gate of an N-channel transistor 26. A first source/drain of the N-channel transistor 24 is connected to ground and a second source/drain of the N-channel transistor 24 is connected to a first source/drain of a P-channel transistor 28. A second source/drain of P-channel transistor 28 is connected to the programming signal ($V_{pp}$) The first source/drain of N-channel transistor 26 is connected to ground and a second source/drain of N-channel transistor 26 is connected to the first source/drain of a P-channel transistor 30, the gate of P-channel transistor 28, and the gate of a P-channel transistor 32.

The gate of P-channel transistor 30 is connected to the second source/drain of N-channel transistor 24, the first source/drain of P-channel transistor 28, the gate of a P-channel transistor 34 and to the first source/drains of a P-channel transistor 36 and an N-channel transistor 38. The second source/drain of P-channel transistor 30 is connected to $V_{pp}$ P-channel transistor 32 has a first source/drain connected to the drain of a FAMOS transistor 40, a first source/drain of an N-channel transistor 42, the first source/drain of an N-channel transistor 44 and the first source/drain of a N-channel transistor 46. A second source/drain of P-channel transistor 32 is connected to $V_{pp}$. The first source/drain of P-channel transistor 34 is connected to the second source/drain of N-channel transistor 46 and the input to an inverter 48. The second source/drain of P-channel transistor 34 is connected to $V_{cc}$. The gate of P-channel transistor 36 is connected to the gate of an N-channel transistor 50 and to the output of an inverter 52. The second source/drain of P-channel transistor 36 is connected to the second source/drain of N-channel transistor 38, the first source/drain of N-channel transistor 50 and the control gate of the FAMOS transistor 40. The gate of the N-channel transistor 38 is connected to the input to inverter 52 and the output of NAND gate 18. The source of FAMOS transistor 40 is connected to a first source/drain of an N-channel transistor 54. The second source/drain of N-channel transistor 42 is connected to ground and the gate of N-channel transistor 42 is connected to a HVTP signal. The gate of N-channel transistor 46 is connected to $V_{cc}$. The output of inverter 48 is connected to the input of inverter 56 which outputs a "LOCKOUT"signal. The second source/drain of N-channel transistor 50 is connected to $V_{cc}$. The gate of N-channel transistor 54 is connected to WET and the second source/drain of N-channel transistor 54 is connected to ground.

The second source/drain of N-channel transistor 44 is connected to $V_{cc}$. The gate of N-channel transistor 44 is connected to a first plate of a capacitor 58. The second plate of the capacitor 58 is connected to $V_{pp}$. Capacitor 58 may be fabricated by connecting the source and drain of an N-channel transistor.

The first plate of the capacitor 58 is also connected to a first source/drain of an N-channel transistor 60. The second source/drain of N-channel transistor 60 is connected to ground. The gate of N-channel transistor 60 is connected to the output of an inverter 62. The input of the transistor 60 is connected to ground.

In operation, the LOCKOUT signal is used to prevent writing to an array memory (not shown) once the FAMOS transistor 40 has been programmed (set to "1"). During array programming, the lock-bit circuit 10 reads the FAMOS transistor 40. If the FAMOS transistor 40 is erased (set to "0"), the signal LOCKOUT will be a "0" which enables the memory array to be programmed. If the FAMOS transistor 40 is programmed, the signal LOCKOUT will be a "1" and the memory array will be protected from programming. The signals for programming and reading the FAMOS transistor 40 are shown in Table I.

TABLE I

| MODE | PLE | WET | PE2 |
| --- | --- | --- | --- |
| Program FAMOS transistor | 1 | 1 | 1 |
| Read FAMOS transistor | 0 | 1 | X |
| Power-down FAMOS transistor | all other cases | | |

X = don't care.

Devices 14, 16, 18, 20, 22 and 52 decode the modes of operation set forth in Table I. Transistors 24, 26, 28 and 30 forms a high voltage switch which transfers $V_{pp}$ to the gate of the FAMOS transistor 40 during programming. Transistors 36 and 38 disable the high voltage switch during a read of the FAMOS transistor 40. Devices 32, 40 and 54 form the programming path of the FAMOS transistor. Transistor 42 may be used in a test mode to override a programmed FAMOS transistor 40. Transistors 34, 40, 46, 50, and 54 are used in reading the FAMOS transistor 40. Transistor 50 biases the gate of the FAMOS transistor 40 while transistors 34 and 46 provide the load circuit. Inverters 48 and 56 buffer the output LOCKOUT.

In an important aspect of the invention, the ESD protection circuit 12 prevents the FAMOS transistor 40 from being inadvertently programmed by an ESD strike. During an ESD strike on $V_{pp}$, the capacitor 58 couples the gate of the N-channel transistor 44 with $V_{pp}$. As $V_{pp}$ rises in response to the ESD strike, the potential at the gate of the N-channel transistor 44 will rise, until such point that the transistor 44 turns on. When the transistor 44 turns on, the drain of the FAMOS transistor 40 is coupled to $V_{cc}$, which has a high capacitance. Alternatively, transistor 44 could couple the drain of the FAMOS transistor to any high capacitance node. The high capacitance connected to the drain of the FAMOS transistor 40 will prevent the elevated $V_{pp}$ from programming of the transistor. The N-channel transistor 60 is a long-channel device which turns off N-channel transistor 44 after a short period of time to allow reading of the FAMOS transistor 40 once $V_{pp}$ has returned to normal levels.

While the ESD protection circuit of the present invention has been illustrated in connection with a lock-bit circuit, it should be noted that it could be used with other devices where a electrostatic discharge, or similar event, would inadvertently program a FAMOS transistor, memory all or other memory device. The FAMOS transistor protected by the circuit may have any number of applications. Further, the ESD protection circuit 12 may be adapted to protect several FAMOS transistors, either alone or in conjunction with other similar protection circuits.

The present invention provides the technical advantage of protecting FAMOS transistors from ESD strike using a minimal amount of additional circuitry.

Although the present invention has been described in detail, it should be understood that various changes, substitutions and alterations can be made herein without departing from the spirit and scope of the invention as defined by the appended claims.

What is claimed is:

1. Circuitry for preventing an electrostatic discharge or other voltage spike affecting a programming signal from programming a memory cell, comprising:
   a voltage node coupled to receive the programming signal and to an input to the memory cell; and
   switching circuitry for coupling said memory cell input to a high capacitance node responsive to the electrostatic discharge or other voltage spike affecting the programming signal;
   said switching circuitry comprising a MOS transistor having a gate coupled to the programming signal, a first source/drain coupled to said memory capacitance node and a second source/drain coupled to said memory cell input such that said MOS transistor conducts between said first and second source/drains responsive to an electrostatic discharge.

2. The circuitry of claim 1 wherein said switching circuitry further comprises a capacitor coupled between said programming signal and the gate of said MOS transistor.

3. The circuitry of claim 2 wherein said capacitor comprises a second MOS transistor having connected source/drains.

4. The circuitry of claim 2 and further comprising discharge circuitry connected to the gate of said MOS transistor such that the voltage at the gate of said MOS transistor is dissipated after the electrostatic discharge or other voltage spike subsides.

5. The circuitry of claim 1 and further comprising discharge circuitry to decouple said memory cell input from said high capacitance node after said electrostatic discharge or other voltage spike has subsided.

6. The circuitry of claim 1 wherein said non-volatile memory comprises a FAMOS transistor.

7. The circuitry of claim 1 wherein said high capacitance node comprises a node coupled to $V_{cc}$.

8. A non-volatile memory device having protection from an electrostatic discharge comprising:
   a FAMOS transistor having a control gate, a floating gate, a source and a drain;
   circuitry for selectively programming said FAMOS transistor, said circuitry operable to couple a programming signal to said drain;

circuitry for selectively reading said FAMOS transistor;

a high capacitance node; and switching circuitry for coupling aid drain to a high capacitance node responsive to an electrostatic discharge affecting said programming signal.

9. The circuitry of claim 8 wherein said high capacitance node comprises a node coupled to $V_{cc}$.

10. The circuitry of claim 8 wherein said switching circuitry comprises a MOS transistor having a gate coupled to aid programming signal, a first source/drain coupled to said FAMOS drain and a second source/drain coupled to said high capacitance node such that said MOS transistor conducts between said first and second source/drains responsive to an electrostatic discharge.

11. The circuitry of claim 10 wherein said switching circuitry further comprises a capacitor coupled between said programming signal and the gate of said MOS transistor.

12. The circuitry of claim 11, wherein said capacitor comprises a second MOS transistor having connected source/drains.

13. The circuitry of claim 12 and further comprising discharge circuitry connected to the gate of said MOS transistor such that the voltage at the gate of said MOS transistor is dissipated after the electrostatic discharge subsides.

14. The circuitry of claim 8 and further comprising discharge circuitry to decouple said drain from said high capacitance node after said electrostatic discharge has subsided.

15. A method of protecting a FAMOS transistor from a voltage spike on a programming signal, comprising the steps of:

detecting a voltage spike on said programming signal; and coupling the drain of the FAMOS transistor to a high capacitance node responsive to said voltage spike.

16. The method of claim 15 and further comprising the step of decoupling the drain from the high capacitance node after the voltage spike has subsided.

17. the method of claim 15 wherein the step of coupling the drain to a high capacitance source comprises the step of coupling the drain to $V_{cc}$.

* * * * *